United States Patent
Takase (10) Patent No.: US 7,199,452 B2
(45) Date of Patent: Apr. 3, 2007

(54) SEMICONDUCTOR DEVICE AND MANUFACTURING METHOD FOR SAME

(75) Inventor: Kenji Takase, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 44 days.

(21) Appl. No.: 10/791,750

(22) Filed: Mar. 4, 2004

(65) Prior Publication Data

US 2004/0173877 A1  Sep. 9, 2004

(30) Foreign Application Priority Data

Mar. 6, 2003  (JP) .............................. 2003-060083

(51) Int. Cl.
*H01L 23/552* (2006.01)

(52) U.S. Cl. .................. 257/660; 257/659; 257/99; 257/E33.056

(58) Field of Classification Search ................ 257/660
See application file for complete search history.

(56) References Cited

U.S. PATENT DOCUMENTS

| | | | | | |
|---|---|---|---|---|---|
| 4,447,492 | A | * | 5/1984 | McKaveney | ................ 428/328 |
| 4,774,638 | A | * | 9/1988 | Caires | ........................ 362/156 |
| 5,038,782 | A | * | 8/1991 | Gevins et al. | ............... 600/383 |
| 5,270,493 | A | * | 12/1993 | Inoue et al. | ................. 174/253 |
| 5,656,857 | A | * | 8/1997 | Kishita | ........................ 257/690 |
| 5,668,406 | A | * | 9/1997 | Egawa | ........................ 257/690 |
| 6,060,774 | A | * | 5/2000 | Terui | ............................ 257/692 |
| 6,111,310 | A |  | 8/2000 | Schultz | |
| 6,346,721 | B1 |  | 2/2002 | Schultz | |
| 6,590,152 | B1 | * | 7/2003 | Horio et al. | ........... 174/35 GC |
| 2002/0000327 | A1 | * | 1/2002 | Juso et al. | ................... 174/250 |

FOREIGN PATENT DOCUMENTS

| | | |
|---|---|---|
| JP | 2001-127310 A | 5/2001 |
| JP | 2003-124498 A | 4/2003 |

* cited by examiner

*Primary Examiner*—Tu-Tu Ho
(74) *Attorney, Agent, or Firm*—Birch, Stewart, Kolasch & Birch, LLP (57) ABSTRACT

A semiconductor device in which semiconductor chip(s) is or are mounted onto substrate(s) incorporating patterned wiring and the entirety or entireties has or have been sealed with resin(s), wherein by forming electrically conductive pattern(s) for shielding at end face(s) at top(s) of substrate(s) and attaching such electrically conductive pattern(s) to region(s) of ground plane pattern(s) on circuit board(s) of apparatus(es) which is or are provided with such semiconductor device(s), it is possible to shield semiconductor device(s) even without use of shield case(s). In such case, by applying material(s) possessing good shielding characteristics, e.g., gold plating, over electrically conductive pattern(s), it is possible to increase sensitivity with respect to electromagnetic noise and improve shielding effect (anti-electromagnetic-noise effect).

16 Claims, 7 Drawing Sheets

Dicing lines

SEMICONDUCTOR DEVICE AND MANUFACTURING METHOD FOR SAME

BACKGROUND OF INVENTION

This Nonprovisional application claims priority under 35 U.S.C. §119(a) on patent Application No. 2003-060083 filed in Japan on Mar. 6, 2003, the entire contents of which are hereby incorporated by reference.

The present invention pertains to a semiconductor device that may be used for sensors and/or for data communications which make use of light, and to a manufacturing method for same. More particularly, the present invention pertains to a semiconductor device that may be used in an infrared communication device, and to a manufacturing method for same.

Figure 7:
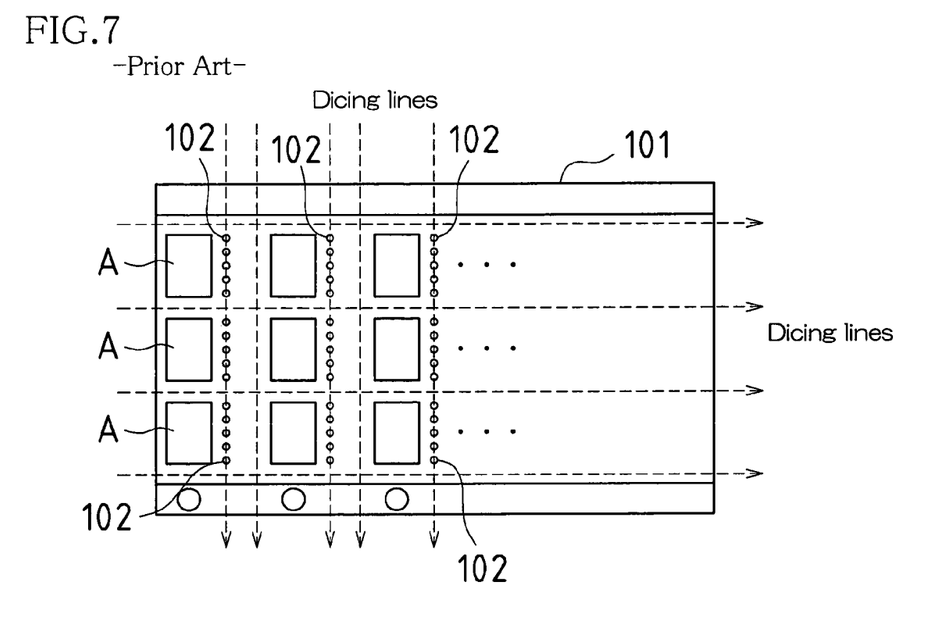
FIG. 7 is a process drawing to assist in describing a method of manufacturing a semiconductor device in accordance with the conventional art.

Referring to FIG. 7, a manufacturing method for a conventional semiconductor device, e.g., an infrared communication device, will be described.

Figure 8:
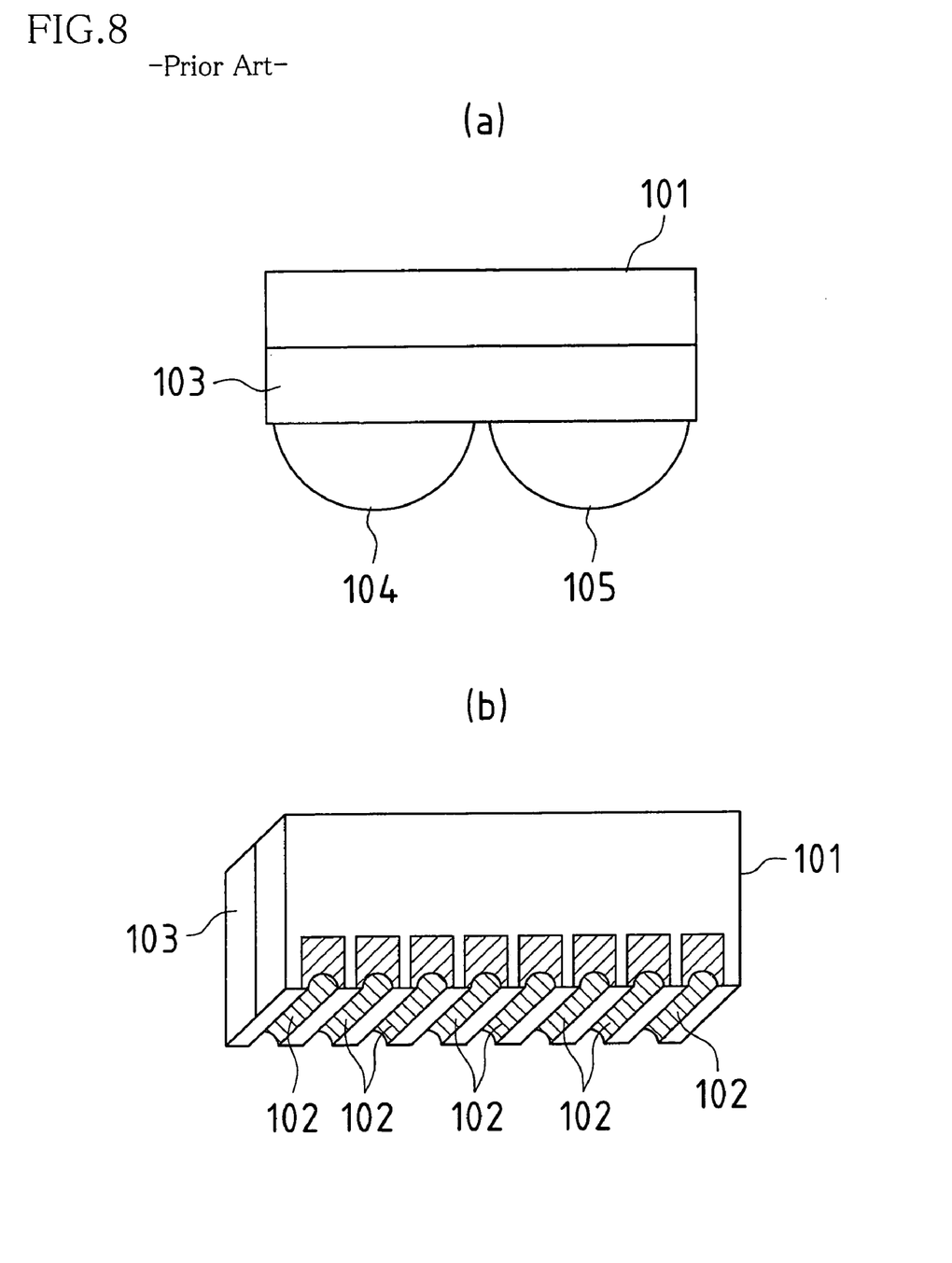
FIG. 8(a) is a plan view of a conventional semiconductor device as viewed from above.
FIG. 8(b) is an oblique view of the bottom of a conventional semiconductor device as viewed from the back.

First, substrate 101 is prepared, a plurality of fields containing patterned wiring, not shown, being formed horizontally and vertically thereon; light emitting diode chips, photodiode chips, IC chips, and/or other such semiconductor chips, not shown, are incorporated into the respective patterned wiring fields of substrate 101, being mounted thereon by means of die bonding, wire bonding, and/or the like; and by thereafter using resin to mold the entirety of each together with a light-emitting lens portion and a light-receiving lens portion, a plurality of semiconductor device blocks (semiconductor device units) A, A, . . . are formed horizontally and vertically. Such state of affairs is shown in FIG. 7, the lines shown as dashed lines in the drawing being horizontal and vertical dicing lines. A drill or the like is thereafter used to form circular through-holes 102, 102, . . . in parallel fashion with respect to the vertical dicing lines, at locations for forming terminals at respective semiconductor device blocks A, A, . . . ; copper plating is applied to the inside circumferential surfaces of these through-holes 102, 102, . . . ; and the substrate is then cut vertically and horizontally along the dicing lines. As a result, a semiconductor device of shape as shown in FIG. 8 is formed.

FIG. 8(a) is a plan view of an infrared communication device as viewed from above. FIG. 8(b) is an oblique view of the bottom of an infrared communication device as viewed from the back. Note that, at FIG. 8(a), reference numeral 103 is the molded resin portion, reference numeral 104 is the light-emitting lens portion, and reference numeral 105 is the light-receiving lens portion.

Figure 9:
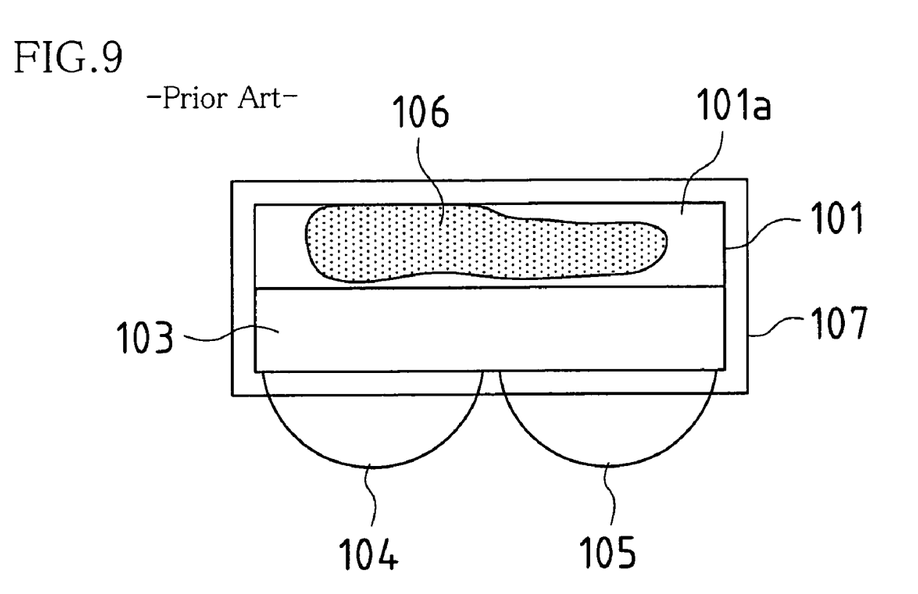
FIG. 9 is a plan view, as viewed from above and drawn such that it is possible to see through the top and view the features therebelow, showing how a shield case is attached to a semiconductor device in accordance with the conventional art.

Furthermore, FIG. 9 shows a situation in which shield case 107 is attached by way of adhesive 106 to the top face 101a of substrate 101 of the infrared communication device constituted as described above. Note, however, that FIG. 9 is drawn such that it is possible to see through shield case 107 attached thereto and view the features therebelow.

Infrared communication devices (hereinafter referred to simply as "device(s)") of such construction may be used in a wide variety of applications—e.g., personal computers, PDAs, and printers—in optical and/or wireless communication fields where data communication is involved. However, regardless of the product in question, the device is never used on its own, infrared communication instead being but one function which is always incorporated into some apparatus or the other. That is, because the infrared communication device is installed within an apparatus, the problem has existed that communications carried out by the device can be affected by interference due to electromagnetic noise which is generated by the apparatus itself and/or electromagnetic noise from the exterior (e.g., mobile telephones, household appliances, and other such products which generate electromagnetic waves, and so forth). For increasing ability to withstand such electromagnetic noise, conventional strategies have therefore increased resistance to electromagnetic noise by shielding the device as a result of enclosing same within a shield case (see, e.g., Japanese Patent Application Publication Kokai No. 2001-127310) or by adding electromagnetic-noise-resisting circuitry to the IC circuitry.

Furthermore, as customers demand smaller sizes and lower profiles in media requiring infrared communication (primarily personal computers, PDAs, and other such information terminal equipment and so forth), decreases in device size have necessitated strategies such as elimination of the shield case and reduction in terminal surface area through reduced terminal pitch, despite the fact that the environment with respect to electromagnetic noise within the media is more stringent than was the case conventionally.

Thus, the trend toward reduced infrared communication device size has in fact caused decreased resistance to electromagnetic noise as result of elimination of the shield case despite the fact that there is more need than was the case conventionally to increase resistance to electromagnetic noise, resulting in abnormal operation of the device and preventing reliable communication. Especially with the recent increases in data communication speeds, the effects of noise can no longer be ignored.

Furthermore, whereas the presence of the shield case had conventionally provided some basis for acceptable antinoise characteristics, the recent proliferation of mobile telephones has brought a further steady worsening of the environment with respect to electromagnetic noise, to the point where the mere inclusion of a shield case can no longer be considered to be a completely acceptable strategy. Furthermore, where a shield case had been provided, in the device disclosed at the aforementioned Japanese Patent Application Publication Kokai No. 2001-127310—like the infrared communication device shown in FIG. 9—the shield case was merely attached by adhesive to the device, the absence of any provision for establishing electrical continuity with the device necessitating that terminal(s) be provided for connecting to ground. And this has resulted in the problem that it has caused the device itself to increase in size.

Furthermore, with respect to the other strategy for dealing with electromagnetic noise, i.e., adoption of a constitution in which electromagnetic-noise-resisting circuitry is added to the IC circuitry, because this causes considerable increase in the number of circuit elements as well as increased IC chip surface area, the concomitant increase in cost and increase in device dimensions have been problems.

Moreover, with respect to the increased mounting strength required to mount the device terminal portion to the apparatus circuit board, the diameter of terminal through-holes 102 formed at substrate 101, as shown in FIG. 8(b), has conventionally been made small, increasing the surface area available for adhesion by solder. But decreased diameter at through-holes 102 has placed demands on dicing precision, such that in practice any displacement and/or stresses resulting therefrom has caused disappearance of terminals and/or peeling of copper foil from the end face thereof, resulting in defective product and leading to increases in cost due to lowered yield.

The present invention was conceived in order to solve such problems; an embodiment of the present invention provides a semiconductor device permitting improved performance with respect to electromagnetic noise while at the same time accommodating reduction in device size as well as profile, and a manufacturing method for same.

SUMMARY OF INVENTION

In accordance with one or more embodiments of the present invention, a semiconductor device in which one or more semiconductor chips have been mounted onto one or more substrates incorporating patterned wiring and the entirety has been sealed with one or more resins is such that one or more electrically conductive patterns for shielding is or are formed at one or more end faces at the top of at least one of the substrate or substrates. Here, at least one of the electrically conductive pattern or patterns may formed from copper foil. In this way, by forming electrically conductive pattern(s) for shielding at end face(s) at top(s) of substrate(s) and attaching such electrically conductive pattern(s) at region(s) of ground plane pattern(s) on circuit board(s) of apparatus(es) which is or are provided with such semiconductor device(s), it is possible to shield semiconductor device(s) even without use of shield case(s). In such case, by applying material(s) possessing good shielding characteristics, e.g., gold plating, over copper foil, it is possible to increase sensitivity with respect to electromagnetic noise and improve shielding effect (anti-electromagnetic-noise effect).

Furthermore, one or more shield cases may be attached over at least one of the electrically conductive pattern or patterns by way of one or more intervening electrically conductive adhesives. In such a case, at least one surface of at least one of the shield case or cases may be plated with gold. This will permit further improvement in shielding effect. Furthermore, application of gold plating will make it possible to prevent occurrence of degradation in characteristics due to the effects of contact resistance and/or occurrence of solder defects due to copper foil surface oxidation.

Furthermore, in the event that gold plating is applied to shield case(s), and/or in the event that gold plating is applied to electrically conductive pattern(s), silver paste may be applied to electrically conductive pattern(s) before attaching shield case(s). Due to compatibility between silver paste and gold plating, this makes it possible to improve adhesive strength.

Furthermore, in accordance with one or more embodiments of the present invention, a semiconductor device in which one or more semiconductor chips have been mounted onto one or more substrates incorporating patterned wiring and the entirety or entireties has or have been sealed with one or more resins is such that one or more electrically conductive patterns is or are formed at one or more end faces at the bottom of at least one of the substrate or substrates; and at least as many terminal or terminals of such number, size, and shape as is or are sufficient for connection to the patterned wiring is or are formed by using one or more dies to blank out at least one region at or in the vicinity of at least one of the electrically conductive pattern or patterns. By thus using die(s) to blank out and shape terminal region(s), copper foil can be formed at terminal end face(s), and because the surface area of that copper foil can be made greater than the surface area of copper foil at terminal end face(s) in semiconductor device(s) of conventional structure, it is possible to improve mounting strength with respect to apparatus circuit board(s).

Here, by causing shape(s) of terminal(s) to be formed so as to be rectangular in cross-section and so as to protrude to the exterior, it is possible when mounting semiconductor device(s) to circuit board(s) of apparatus(es) to achieve mounting such that there is good positional accuracy during reflow mounting due to self-alignment effect resulting from positional displacement.

Furthermore, a semiconductor device manufacturing method in accordance with one or more embodiments of the present invention comprises forming a plurality of patterned wiring fields horizontally and vertically on one or more substrates, at least one of the fields containing patterned wiring for connection to one or more semiconductor chips; mounting at least one of the semiconductor chips or chips to at least one of the patterned wiring fields; causing same to undergo die bonding and/or wire bonding and then sealing the entirety of at least one of the mounted semiconductor chips or chips with one or more resins; thereafter forming at least one vertically long set of at least two through-holes in more or less parallel fashion with respect to at least one region at or in the vicinity of at least one end face at at least one side corresponding to at least one top and with respect to at least one region at or in the vicinity of at least one end face at at least one side corresponding to at least one bottom of each of at least one of the semiconductor chip or chips; applying plating to at least a portion of the interior of at least one of the through-hole or through-holes; forming one or more electrically conductive patterns; thereafter using one or more dies to blank out and shape at least one region at or in the vicinity of at least a portion of the through-holes and containing at least one region at or in the vicinity of at least one of the electrically conductive pattern or patterns formed in at least one region at or in the vicinity of at least one of the end face or faces at at least one of the side or sides corresponding to at least one of the bottom or bottoms of at least one of the semiconductor chip or chips so as to form one or more electrically conductive patterns for shielding at or in the vicinity of at least one of the end face or faces at at least one of the side or sides corresponding to at least one of the top or tops of at least one of the semiconductor chip or chips, and so as to form at least as many terminal or terminals of such number, size, and shape as is or are sufficient for connection to the patterned wiring at at least one region at or in the vicinity of at least one of the end face or faces at at least one of the side or sides corresponding to at least one of the bottom or bottoms of at least one of the semiconductor chip or chips; and thereafter cutting in one or more directions perpendicular to at least one of the vertically long set or sets of through-holes so as to divide substantially the entirety into a plurality of individual semiconductor devices.

Because manufacturing method(s) in accordance with embodiment(s) of the present invention make it possible to form electrically conductive pattern(s) for shielding at or in the vicinity of end face(s) at side(s) corresponding to top(s) of semiconductor chip(s) simultaneous with preparation of individual semiconductor device substrate(s), after carrying out dicing and dividing the entirety into individual units, it is possible, by attaching electrically conductive pattern(s) formed at end face(s) of such semiconductor device(s) to region(s) of ground plane pattern(s) formed on circuit board(s) of apparatus(es), to shield semiconductor device(s) even without use of shield case(s). Furthermore, by using die(s) to blank out and form terminal(s) into special shape(s) during formation of end face(s) at bottom(s) of semiconductor chip(s), because greater copper foil surface area can be attained at terminal end face(s) than was the case conventionally, it is possible to increase mounting strength with respect to apparatus circuit board(s).

In such case, shield case(s) may, by way of intervening electrically conductive adhesive(s), be attached to electrically conductive pattern(s) for shielding formed at or in the vicinity of end face(s) at side(s) corresponding to top(s) of semiconductor chip(s). Thus, because adhesive attachment of shield case(s) to electrically conductive pattern(s) at semiconductor device(s) eliminates the need for shield case terminal(s) for connecting shield case(s) to ground at the outside thereof, reduction in shield case size is made possible; and moreover, it is also possible to reduce or eliminate such problems as mounting defects caused by lifting of shield case(s) during mounting of semiconductor device(s) to circuit board(s).

DESCRIPTION OF PREFERRED EMBODIMENTS

Below, embodiments of the present invention are described with reference to the drawings.

Figure 1:
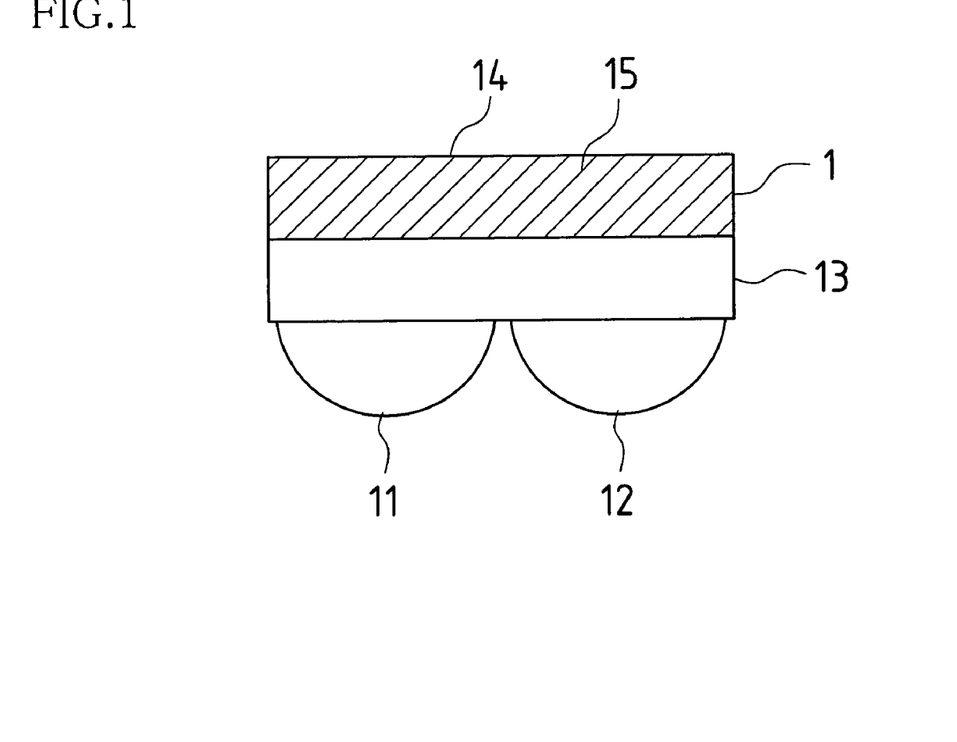
FIG. 1 is a plan view, as viewed from above, of a semiconductor device in accordance with the present invention.
Figure 2:
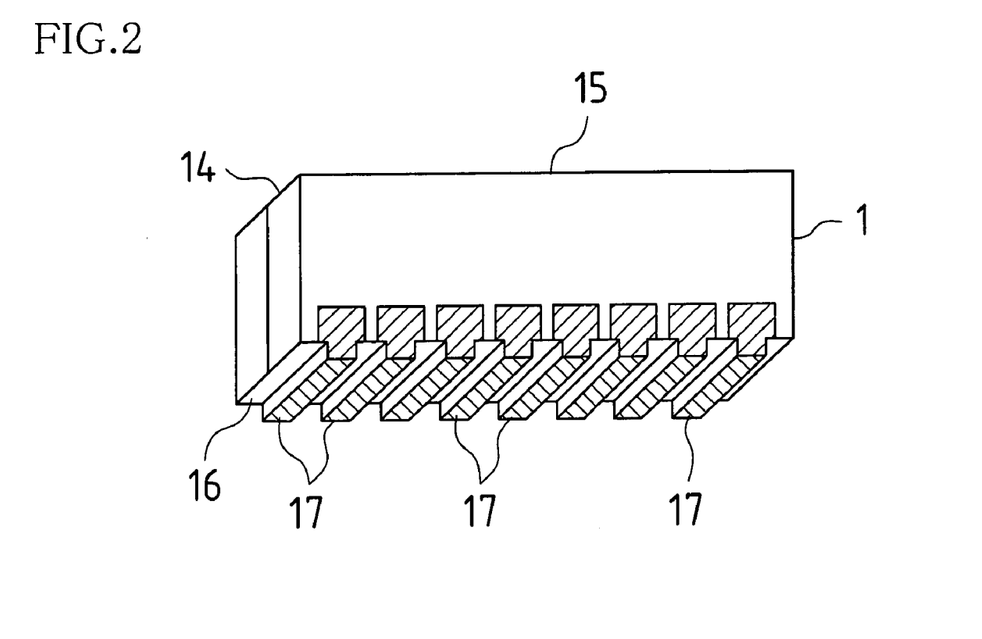
FIG. 2 is an oblique view, as viewed from the back, of the bottom of a semiconductor device in accordance with the present invention.

FIGS. 1 and 2 are drawings showing the external appearance of a semiconductor device in accordance with the present invention, FIG. 1 being a plan view of the semiconductor device as viewed from above, and FIG. 2 being an oblique view of the bottom of the semiconductor device as viewed from the back.

In forming this semiconductor device, substrate(s) 1—patterned wiring, not shown, being formed thereon—is furnished with light emitting diode chip(s), photodiode chip(s), IC chip(s), and/or other such chip(s), not shown; these are mounted thereon by means of die bonding, wire bonding, and/or the like; and molded resin(s) 13 is or are thereafter applied to the entirety thereof together with light-emitting lens portion(s) 11 and light-receiving lens portion(s) 12. In addition, in the present embodiment, the manufacturing method described below is employed to form electrically conductive pattern(s) 15 for shielding at end face(s) 14 at the top of substrate 1 of the semiconductor device having structure as described above; and the manufacturing method described below is employed to form a plurality of terminals 17, for connection to the internal patterned wiring, at end face(s) 16 at the bottom of substrate 1.

By thus forming electrically conductive pattern(s) 15 for shielding at end face(s) 14 at the top(s) of substrate(s) 1 and attaching such electrically conductive pattern(s) 15 at region(s) of ground plane pattern(s) on circuit board(s) of apparatus(es) which is or are provided with such semiconductor device(s), it is possible to shield the semiconductor device(s) from electromagnetic noise even without use of shield case(s).

In the present embodiment, electrically conductive pattern 15 is formed from copper foil. Here, material(s) possessing good shielding characteristics, e.g., gold plating, may be applied to the surface of electrically conductive pattern 15 (hereinafter also referred to as "copper foil pattern"). Application of gold plating will make it possible to prevent occurrence of degradation in characteristics due to the effects of contact resistance and/or occurrence of solder defects due to copper foil surface oxidation. Furthermore, application of material(s) possessing good shielding characteristics, e.g., gold plating, over the copper foil will make it possible to increase sensitivity with respect to electromagnetic noise and improve shielding effect (anti-electromagnetic-noise effect).

Figure 3:
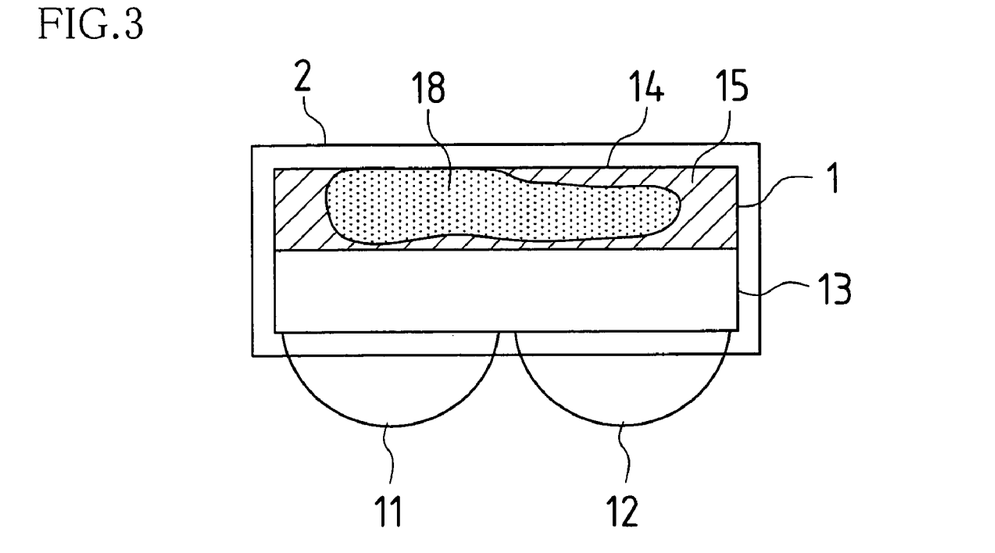
FIG. 3 is a plan view, as viewed from above and drawn such that it is possible to see through the top and view the features therebelow, showing how a shield case is attached to a semiconductor device in accordance with the present invention.

Furthermore, as shown in FIG. 3, by applying electrically conductive adhesive(s) 18 to copper foil pattern 15 formed on end face 14 at the top of substrate 1, attaching shield case(s) 2 over this portion, and adhering and curing this thereto, the entire semiconductor device exclusive of respective lens portions 11, 12 may be enclosed within shield case(s) 2. This will permit more improved shielding effect. Furthermore, because adhesive attachment of shield case 2 to copper foil pattern 15 eliminates the need for shield case terminal(s) for connecting the shield case(s) to ground at the outside thereof, reduction in shield case size is made possible.

In such a case, the surface of shield case 2 may be plated with gold. This will permit further improvement in shielding effect. Furthermore, application of gold plating will make it possible to prevent occurrence of degradation in characteristics due to the effects of contact resistance and/or occurrence of solder defects due to surface oxidation at copper foil pattern 15.

Furthermore, in the event that gold plating is applied to copper foil pattern 15, and/or in the event that gold plating is applied to shield case 2, silver paste may be applied to the copper foil pattern 15 portion before attaching shield case 2. Due to compatibility between silver paste and gold plating, this makes it possible to improve adhesive strength.

Figure 4:
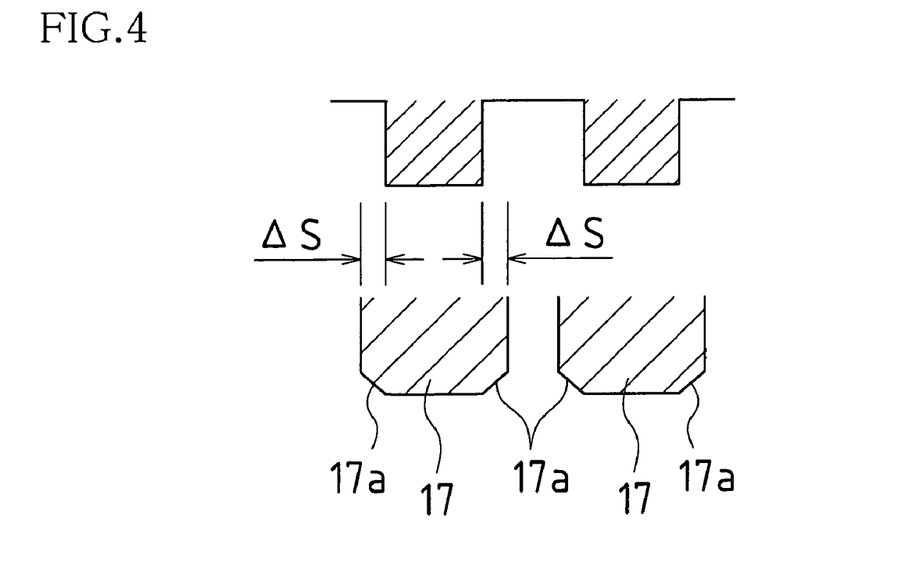
FIG. 4 is a partial enlarged view of the tip portions of terminals in a semiconductor device in accordance with the present invention.

Furthermore, plurality of terminals 17 formed at end face 16 at the bottom of substrate 1 are formed in required number, size, and shape by using die(s) to blank out the electrically conductive pattern portion formed at end face 16 at the bottom of substrate 1 (described below at description of manufacturing method). As shown in FIG. 2, in the present embodiment, terminals 17 are formed with rectangular cross-section and so as to protrude to the exterior. In such case, as shown at the enlarged view of the terminal tip portions in FIG. 4, it is possible by chamfering the corners 17a at either side of terminal(s) 17 to increase the surface area available for soldering by amount(s) corresponding to chamfered face(s) 17a, i.e., by amount(s) corresponding to ΔS. This permits attainment of increased mounting strength during mounting of semiconductor device(s) to apparatus circuit board(s).

Figure 5:
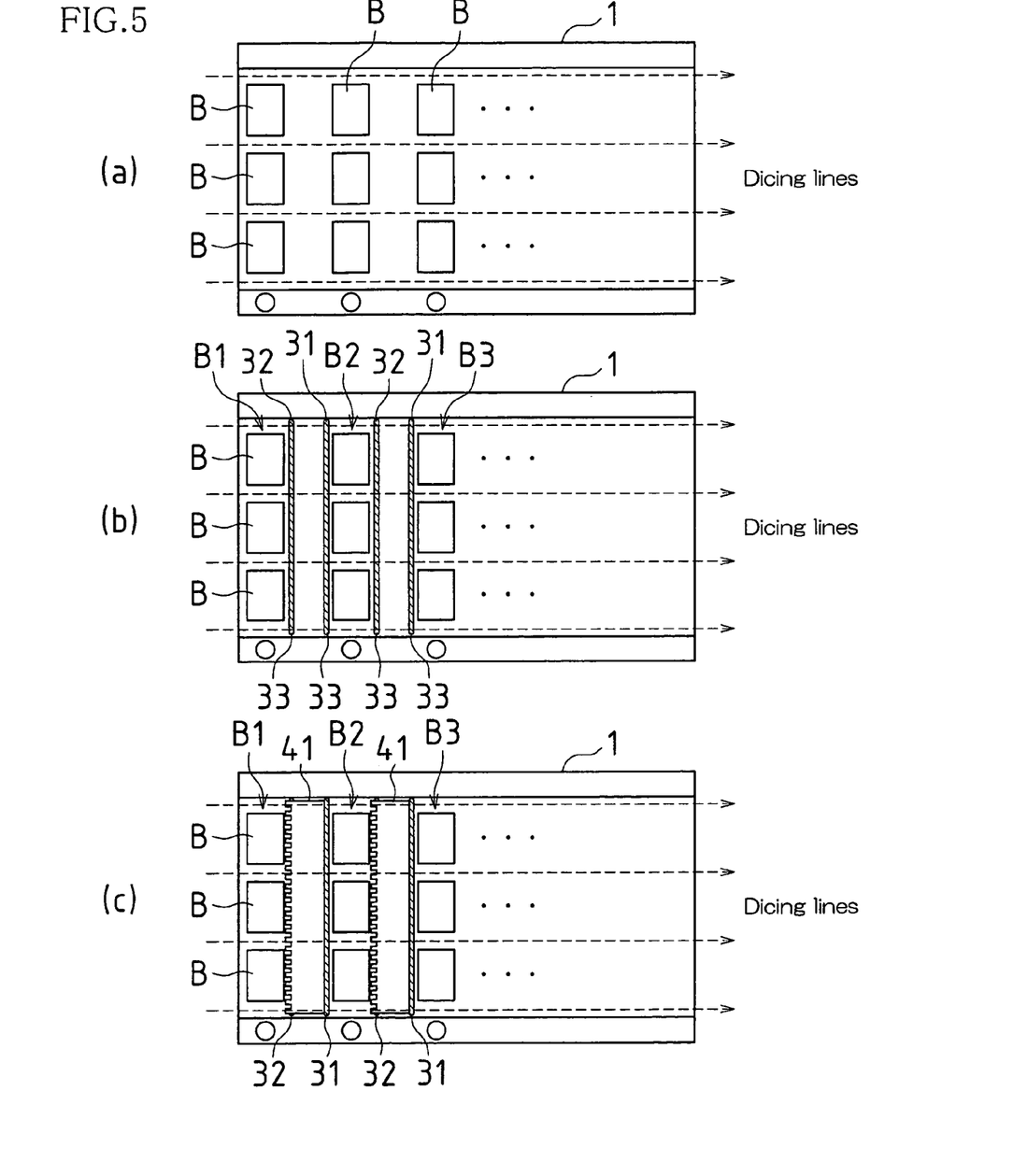
FIG. 5 contains process drawings for describing a method of manufacturing a semiconductor device in accordance with the present invention.
Figure 6:
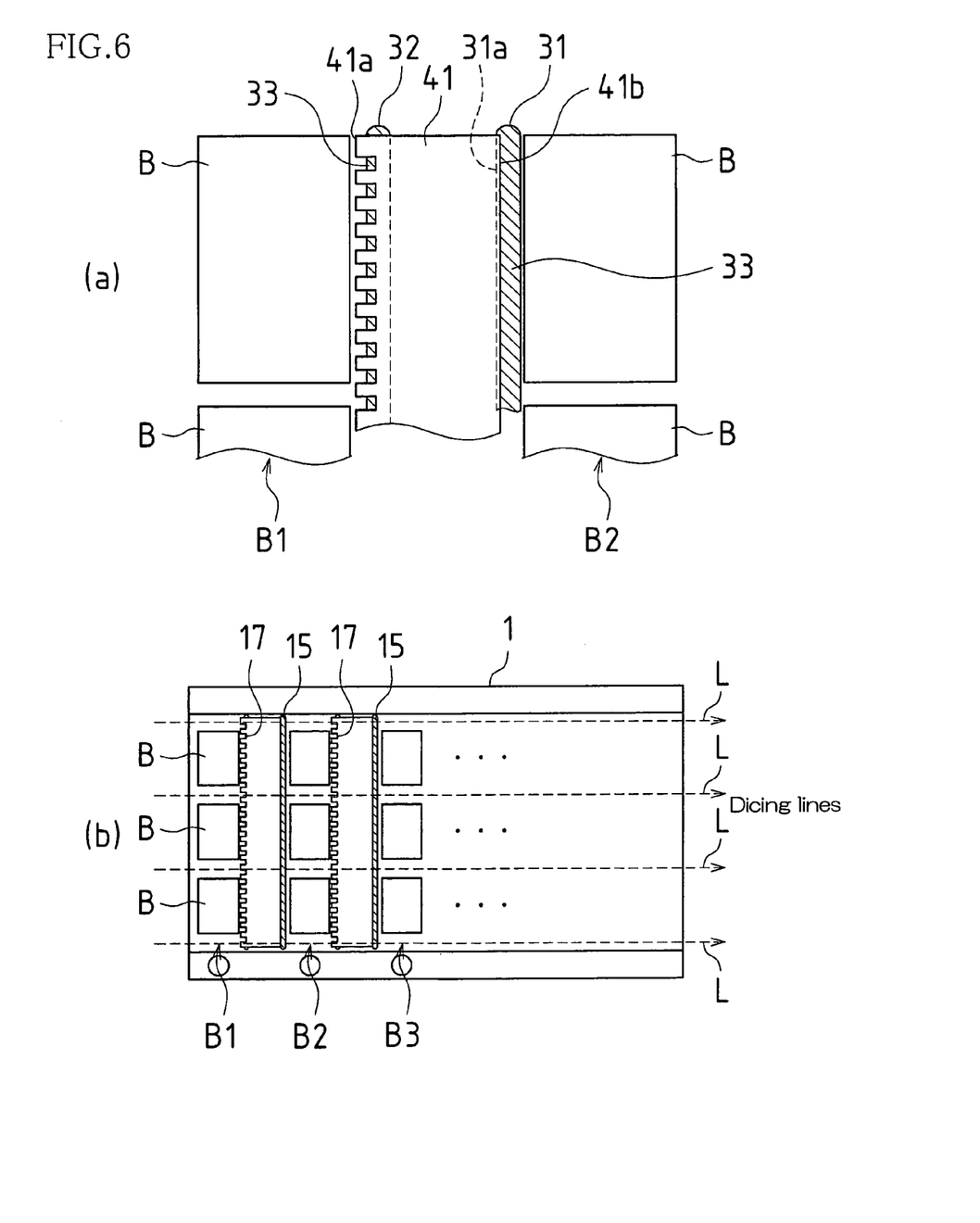
FIG. 6 contains process drawings for describing a method of manufacturing a semiconductor device in accordance with the present invention.

Next, referring to the respective process drawings shown in FIGS. 5 and 6, methods of manufacturing semiconductor devices having the foregoing constitutions are described.

First, substrate 1 is prepared, a plurality of fields containing patterned wiring being formed horizontally and vertically thereon; light emitting diode chips, photodiode chips, IC chips, and/or other such semiconductor chips are incorporated into the respective patterned wiring fields of substrate 1, being mounted thereon by means of die bonding, wire bonding, and/or the like; and by thereafter using resin to mold the entirety of each together with light-emitting lens portion(s) and light-receiving lens portion(s), semiconductor device blocks (semiconductor device units) B, B, . . . are formed horizontally and vertically. Such state of affairs is shown at FIG. 5(a).

Next, as shown at FIG. 5(b), vertically long sets of through-holes 31, 32, . . . are respectively formed in more or less parallel fashion with respect to the end face portion corresponding to the top (the end face at the left side in the drawing) of, and with respect to the end face portion corresponding to the bottom (the end face at the right side in the drawing) of, respective semiconductor device blocks B, B, . . . (each column of semiconductor blocks will hereinafter be referred to collectively as a "block column") which are arranged in vertical fashion, metal plating is applied to the interior of these through-holes 31, 32, . . . , and electrically conductive pattern 33 is formed.

Next, as shown at FIG. 5(c), blanking dies 41 are respectively arranged between respective sets of horizontally adjacent block columns B1, B2, . . . .

Here, as shown in the partial enlarged view at FIG. 6(a), die 41 is such that the left side face portion 41a thereof disposed in opposition to through-holes 32 formed alongside the end face portion corresponding to the bottoms of the blocks at block column B1 is formed after the fashion of a comb having teeth of such number, size, and shape as is consistent with the terminals that are to be formed; and such that the right side face portion 41b thereof disposed in opposition to through-holes 31 formed alongside the end face portion corresponding to the tops of the blocks at block column B2 is formed after the fashion of a straight line lying alongside the side farther from block column B2 of periphery 31a circumscribing through-holes 31 so as to blank out only the substrate 1 portion, leaving undisturbed the entire electrically conductive pattern 33 applied over through-holes 31.

Moreover, as a result of using dies 41 of such shape to carry out blanking on substrate 1, block columns B1, B2, . . . are formed, as shown at FIG. 6(b), in which copper foil pattern 15 is formed at the end face portion corresponding to the top thereof, and plurality of terminals 17, 17, . . . are formed at the end face portion corresponding to the bottom thereof. That is, simultaneous formation of copper foil pattern 15 and terminals 17, 17, . . . is permitted.

Lastly, by subjecting substrate 1, on which block columns B1, B2, . . . have thus been formed, to dicing along dicing lines L as indicated by the dashed lines at FIG. 6(b), it is possible to divide this into the individual semiconductor devices.

As described above, in accordance with one or more embodiments of the semiconductor device and manufacturing method for same of the present invention, by forming electrically conductive pattern(s) for shielding at end face(s) at top(s) of substrate(s) and attaching such electrically conductive pattern(s) at region(s) of ground plane pattern(s) on circuit board(s) of apparatus(es) which is or are provided with such semiconductor device(s), it is possible to shield semiconductor device(s) from electromagnetic noise even without use of shield case(s). In such case, by applying material(s) possessing good shielding characteristics, e.g., gold plating, over electrically conductive pattern(s), it is possible to increase sensitivity with respect to electromagnetic noise and improve shielding effect (anti-electromagnetic-noise effect). Furthermore, because IC circuitry for electromagnetic noise employed as strategy in conventional product is eliminated and because shield case(s) can also be eliminated, the number of required circuit components can be reduced, reductions in cost and in size can be achieved, and it is possible to carry out high-speed communication without abnormal operation despite presence of electromagnetic noise. Furthermore, the semiconductor device associated with the present invention may be favorably used in infrared communication devices. However, its use is not limited to infrared communication devices.

Furthermore, it is possible to further improve shielding effect by attaching shield case(s) over electrically conductive pattern(s) by way of intervening electrically conductive adhesive(s), and/or by applying gold plating to surface(s) of such shield case(s). Furthermore, application of gold plating will make it possible to prevent occurrence of degradation in characteristics due to the effects of contact resistance and/or occurrence of solder defects due to copper foil surface oxidation.

Furthermore, by causing shape(s) of terminal(s) formed at bottom(s) of semiconductor device(s) to be formed so as to be rectangular in cross-section and so as to protrude to the exterior, it is possible when mounting semiconductor device(s) to circuit board(s) of apparatus(es) to achieve mounting such that there is good positional accuracy during reflow mounting due to self-alignment effect resulting from positional displacement. Moreover, by using die(s) to blank out and form terminal(s) into special shape(s) during formation of end face(s) at bottom(s) of semiconductor device(s), because greater copper foil surface area can be attained at terminal end face(s) than was the case conventionally, it is possible to increase mounting strength with respect to apparatus circuit board(s).

What is claimed is:

1. A semiconductor device in which one or more semiconductor chips have been mounted onto front faces of one or more substrates having front faces, rear faces and one or more side faces connecting said front faces and rear faces, said substrates incorporating patterned wiring and the entirety or entireties of the one or more semiconductor chips has or have been sealed with one or more resins, wherein:

one or more electrically conductive patterns for shielding is or are formed at said one or more side faces of at least one of the substrate or substrates;

one or more terminals required for connection between the patterned wiring and at least one of the electrically conductive pattern or patterns is or are formed; and at least one of the terminal or terminals is formed so as to at least partially protrude to the exterior and so as to have at least one more or less rectangular cross-section.

2. A semiconductor device comprising:
a substrate incorporating patterned wiring and having a first surface, a second surface generally parallel to said first surface, and at least one peripheral edge surface connecting said first surface and said second surface;
one or more semiconductor chips mounted on said first surface and sealed with one or more resins; and
an electrically conductive shielding pattern at at least a portion of said at least one peripheral edge surface, wherein
one or more terminals required for connection between the patterned wiring and at least one of the electrically conductive pattern or patterns is or are formed; and
at least one of the terminal or terminals is formed so as to at least partially protrude to the exterior and so as to have at least one more or less rectangular cross-section.

3. A semiconductor device according to claim 1 or 2 wherein:
at least one of the electrically conductive pattern or patterns is at least one copper foil pattern.

4. A semiconductor device according to claim 3 wherein:
at least one plating having good shielding characteristics is applied over at least one of the copper foil pattern or patterns.

5. A semiconductor device according to claim 4 wherein:
at least one of the plating or platings is gold plating.

6. A semiconductor device according to claim 5 wherein:
one or more shield cases is or are attached over at least one of the electrically conductive pattern or patterns by way of one or more intervening silver pastes.

7. A semiconductor device according claim 4 wherein:
one or more shield cases is or are attached over at least one of the electrically conductive pattern or patterns by way of one or more intervening electrically conductive adhesives.

8. A semiconductor device according to claim 5 wherein:
one or more shield cases is or are attached over at least one of the electrically conductive pattern or patterns by way of one or more intervening electrically conductive adhesives.

9. A semiconductor device according to claim 1 or 2 wherein:
one or more shield cases is or are attached over at least one of the electrically conductive pattern or patterns by way of one or more intervening electrically conductive adhesives.

10. A semiconductor device according to claim 9 wherein:
at least one of the shield case or cases is gold-plated.

11. A semiconductor device according to claim 1 or 2 wherein one or more terminals required for connection between the patterned wiring and at least one of the electrically conductive pattern or patterns is or are formed by using one or more dies to blank out and shape at least one region at or in the vicinity of at least one of the electrically conductive pattern or patterns.

12. A semiconductor device according to claim 1 or 2 wherein:
at least one tip portion of said terminal or terminals is chamfered at each side.

13. A semiconductor device according to claim 1 or 2 wherein:
at least one gold plating is applied to at least one end face of at least one of the terminal or terminals.

14. A semiconductor device according to claim 10 wherein:
one or more shield cases is or are attached over at least one of the electrically conductive pattern or patterns by way of one or more intervening silver pastes.

15. A semiconductor device according to claim 2, wherein said at least one peripheral edge comprise a first peripheral edge having terminals and a second edge spaced from said first edge, wherein said electrically conductive shielding pattern covers said second edge.

16. A semiconductor device according to claim 2 wherein said at least one peripheral edge comprises a first edge, a second edge parallel to said first edge and third and fourth edges connecting said first and second edges, wherein said electrically conductive shielding pattern is formed on one of said first, second, third and fourth edges.

* * * * *